(12) United States Patent
Tseng

(10) Patent No.: US 6,903,661 B1
(45) Date of Patent: Jun. 7, 2005

(54) PHOTOCONDUCTIVE ENCODER WHEEL

(75) Inventor: Dennis Tseng, Taipei (TW)

(73) Assignee: Optindex Co., Ltd., Taipei (TW)

( * ) Notice: Subject to any disclaimer, the term of this patent is extended or adjusted under 35 U.S.C. 154(b) by 0 days.

(21) Appl. No.: 10/734,268

(22) Filed: Dec. 15, 2003

(51) Int. Cl.$^7$ .................................................. H03M 1/22
(52) U.S. Cl. ............................................ 341/2; 341/35
(58) Field of Search ................................ 341/2, 13, 17, 341/35

(56) References Cited

U.S. PATENT DOCUMENTS

| | | | | |
|---|---|---|---|---|
| 4,965,503 A | * | 10/1990 | Watanabe et al. ........... | 318/671 |
| 5,519,393 A | * | 5/1996 | Brandestini ................... | 341/10 |
| 5,608,394 A | * | 3/1997 | Hirabayashi ................. | 341/11 |
| 5,821,531 A | * | 10/1998 | Nomura et al. ........ | 250/231.13 |
| 5,837,999 A | * | 11/1998 | Horiuchi ................ | 250/231.14 |
| 6,031,222 A | * | 2/2000 | Carapelli ............... | 250/231.13 |
| 6,194,708 B1 | * | 2/2001 | Wang et al. ........... | 250/231.13 |

* cited by examiner

Primary Examiner—Michael Tokar
Assistant Examiner—Linh V. Nguyen
(74) Attorney, Agent, or Firm—Rosenberg, Klein & Lee

(57) ABSTRACT

A photoconductive encoder structure has a grating cogwheel made of light-pervious materials, a sensor and two luminescence elements perpendicular to each other. An incident surface of the grating cogwheel surrounds a protruding surface, and protruding wheel parts divided in equal arc-shapes surround the grating cogwheel for focusing light from a light source by the protruding surface of the grating cogwheel. Moreover, the light is refracted to the corresponding protruding wheel parts for focusing again. Finally, the light is transmitted to the sensor to generate different phase sequence signals. Owing to the structure, a number of cogs surrounding a grating cogwheel is increased, and, at the same time, the structure does not affect convenience in the production process.

3 Claims, 5 Drawing Sheets

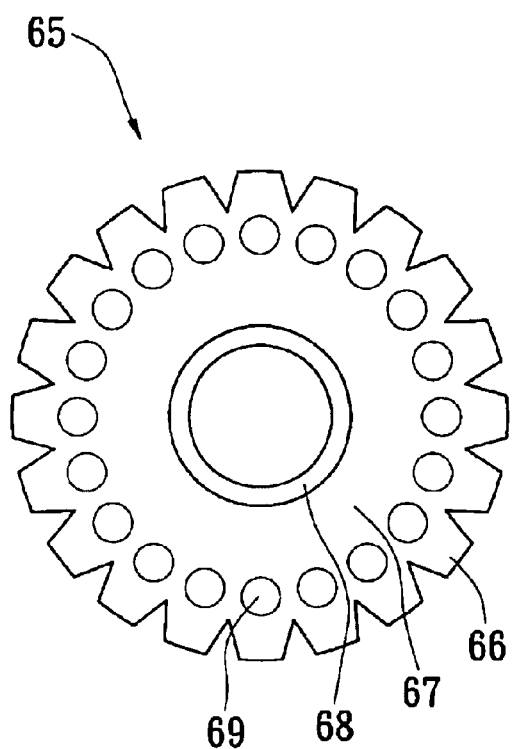
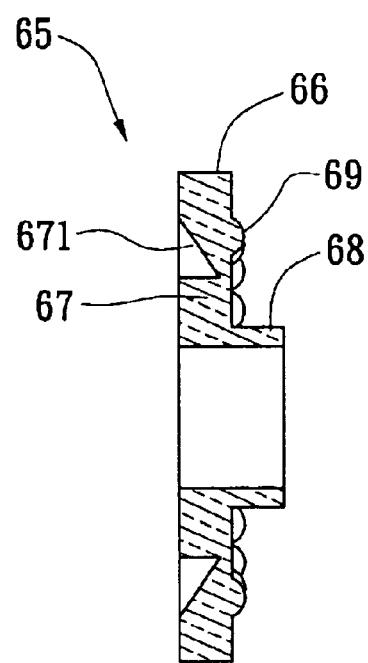
FIG. 2A
PRIOR ART
FIG. 2B
PRIOR ART

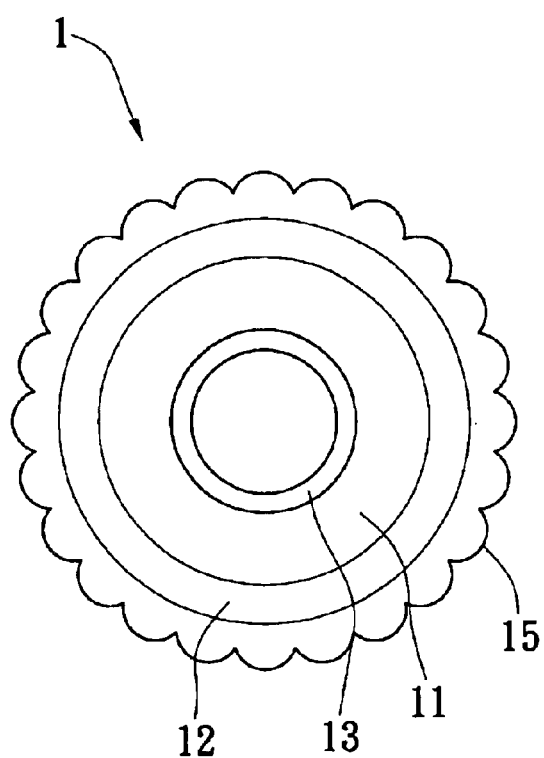 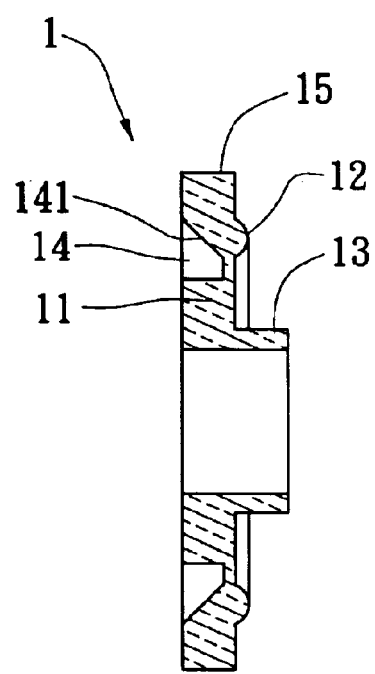
FIG. 4A                    FIG. 4B

PHOTOCONDUCTIVE ENCODER WHEEL

BACKGROUND OF THE INVENTION

1. Field of the Invention

The present invention relates to a photoconductive encoder structure, and especially to a photoconductive encoder with more cogs surrounded a grating cogwheel and a better focusing effect of a light source. Furthermore, the production process of the grating cogwheel is more convenient.

2. Description of Related Art

A prior art mouse comprises an X-axis encoder and a Y-axis encoder with output logic sequence signals such as, for example, 11, 10, 00, 01. The mouse is placed on a top or other surface of a desk and is moved in designated directions to move a cursor on a monitor to corresponding positions. The movement of the cursor on the monitor made by the mouse adopts a principle that the X-axis and the Y-axis encoders together produce control signals to move the cursor.

Reference is made to FIG. 1; an encoder mainly comprises a light source 60, an encoder wheel 65, and a sensor (using two juxtaposed sensing chips S1 and S2 to produce phase signals) 70. When the encoder is in operation, light emitted by the luminescence element 60 and received by the sensor 70 is sheltered or not sheltered by the encoder wheel 65. The sensor 70 generates sequence signals including OFF (0) and ON (1). For example, when the grating cogwheel 65 rotates clockwise, the sensor 70 generates repeated and continuous sequence signals 111000011 . . . ; and when the grating cogwheel 65 rotates counterclockwise, the sensor 70 generates repeated and continuous sequence signals 01001011010001 . . . for circuit encoding.

Reference is made to FIG. 2A and FIG. 2B, in which the grating cogwheel 65 comprises a housing 67 having square cogs 66. A cylinder 68 with a cylindrical space defined therein protrudes from the center of the housing 67. A plurality of bumps 69 are set on the corresponding square teeth 66 along the circumference of an incident surface on the housing 67. Therefore, the light emitted by the luminescence element 60 is projected on the incident surface of the grating cogwheel 65 and then focused. The focused light is refracted by a triangle-shaped section 671 to the top of the square cogs 66 and then projected to the sensor 70. Because of the rotation of the grating cogwheel 65, the sensitization chips S1 and S2 produce OFF (0) and ON (1) sequence signals for circuit encoding.

The depth and the width of the two adjacent square cogs 66, and the numbers of the granules 69 in the structure of the grating cogwheel 65, are also important factors in the production process. Therefore, the numbers of the square cogs 66 and the granules 69 on the grating cogwheel 65 are limited to a fixed value.

SUMMARY OF THE INVENTION

An object of the present invention is to provide a photoconductive encoder structure with a greater number of teeth without affection the manufacturing process of the photoconductive encoder wheel.

Another object of the present invention is to provide a photoconductive encoder structure, which can focus light of a light source, refract the light, and finally refocus the light onto a sensor.

To achieve the object of the present invention, an incident surface of a grating cogwheel is surrounded by a protruding surface. Divided protruding wheel parts in equal arc-shapes surround the grating cogwheel. Light from a light source is first focused by the protruding surface of the grating cogwheel and then refracted to the corresponding protruding wheel parts for focusing. Finally, the light is transmitted to the sensor to produce different phase sequence signals.

Furthermore, the above-mentioned grating cogwheel includes a disk-shaped housing, and a cylinder with a columnar space in it protrudes from the center of the housing.

The above-mentioned housing of the grating cogwheel includes a refracting space to conduct the light focused by the protruding surface to the protruding wheel parts.

The various objects and advantages of the present invention will be more readily understood from the following detailed description when read in conjunction with the appended drawing, in which:

BRIEF DESCRIPTION OF DRAWING

The various objects and advantages of the present invention will be more readily understood from the following detailed description when read in conjunction with the appended drawing, in which:

FIG. 2A shows a front view of a prior art grating cogwheel;

FIG. 2B shows an exploded view of the prior art grating cogwheel;

FIG. 4A shows a front view of a grating cogwheel of the present invention;

FIG. 4B shows an exploded view of the grating cogwheel of the present invention.

DETAILED DESCRIPTION OF PREFERRED EMBODIMENTS

Figure 1:
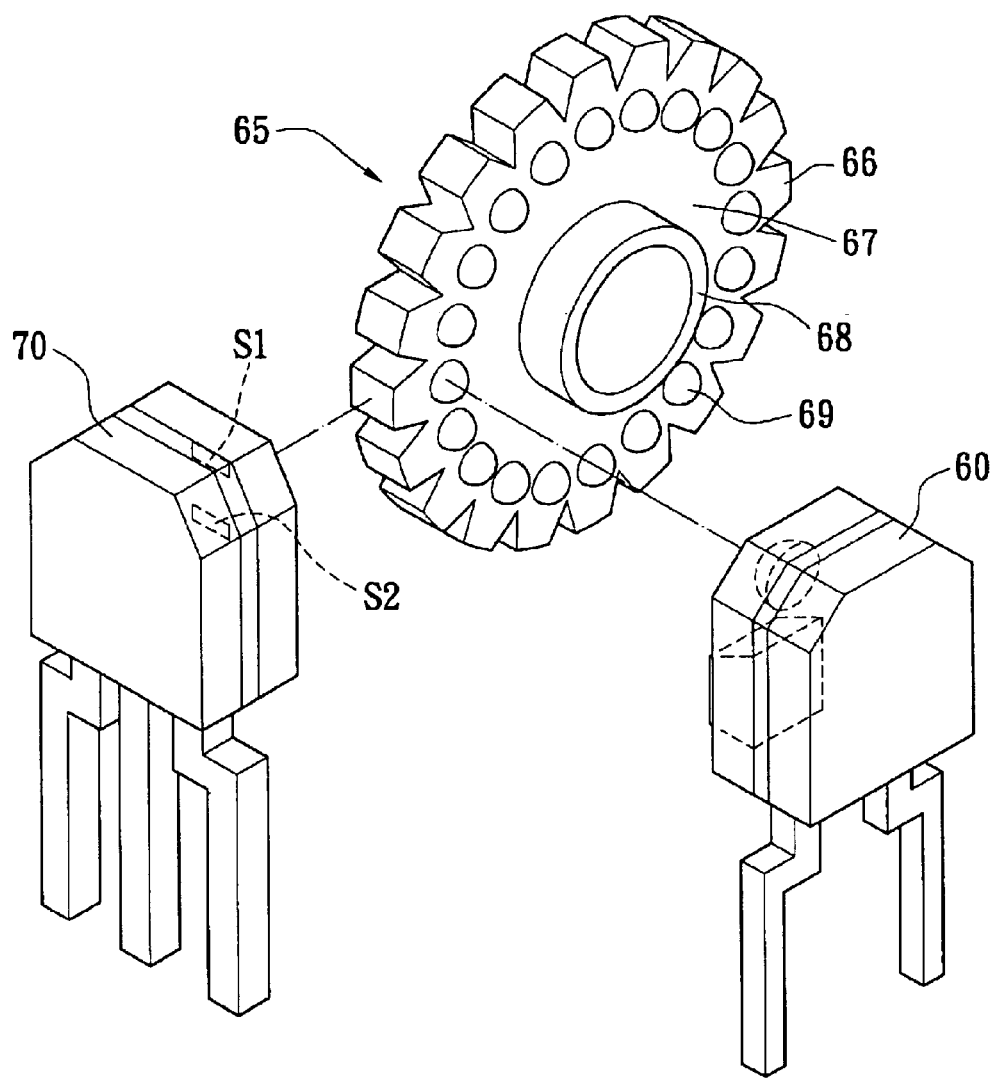
FIG. 1 shows a perspective view of a prior art photoconductive encoder.
Figure 3:
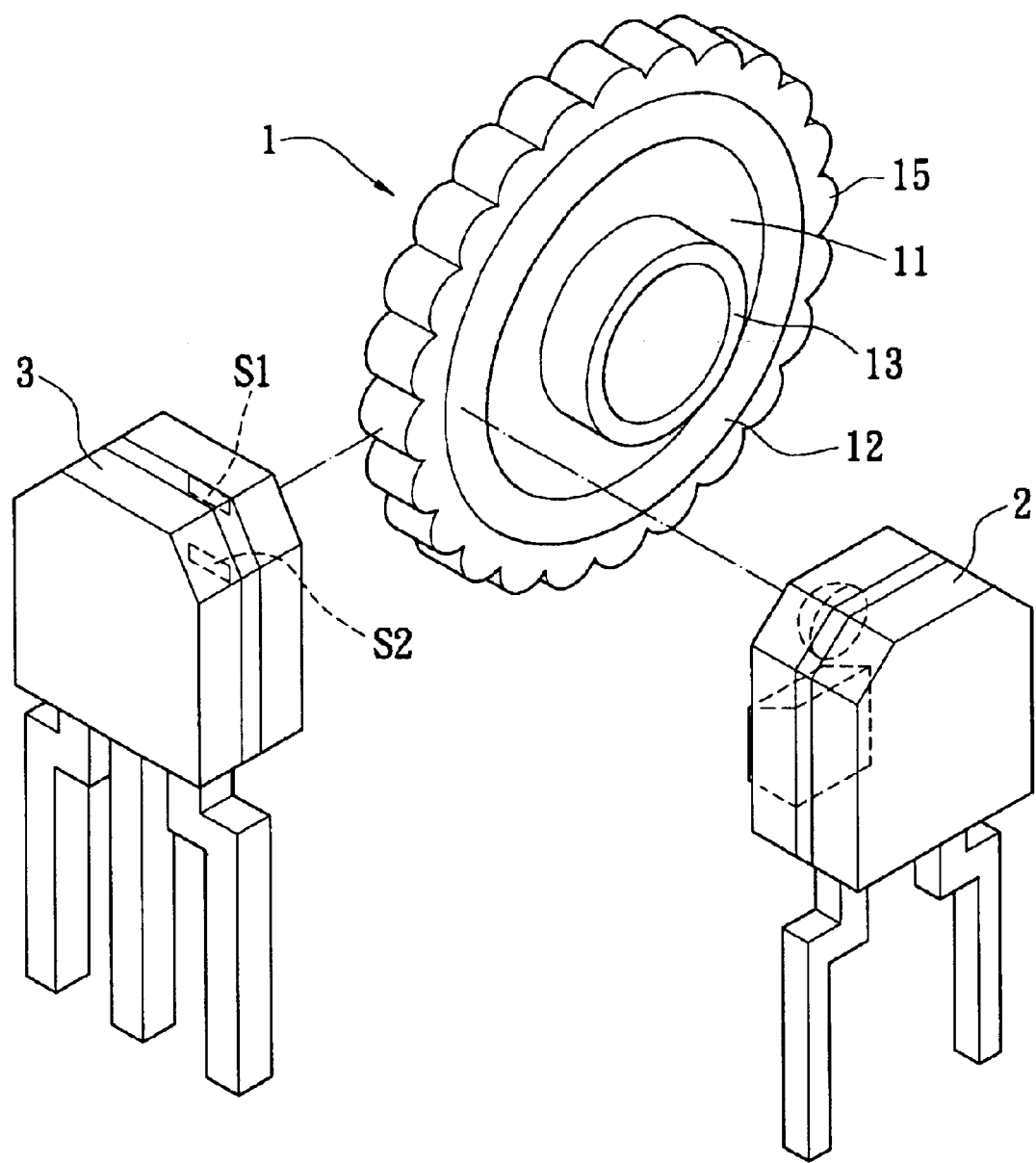
FIG. 3 shows a perspective view of the present invention.

Reference is made to FIG. 3; the present invention is a photoconductive encoder wheel comprising a grating cogwheel 1 made of light-transparent materials such as, for example, acrylic, polycarbonate, or glass, two light sources 2 and a sensor 3 having two rows of sensing chips S1, S2. Light emitted by the luminescence elements 2 is first focused by the grating cogwheel 1 and then refracted; finally, the light is refocused onto the sensing chips S1, S2 of the sensor 3.

Reference is made to FIG. 4A and FIG. 4B. The grating cogwheel 1 includes a disk-shaped housing 11 with a protruding surface 12, and the light emitted by the luminescence elements 2 will first be focused by the protruding surface 12 when the light is projected on it. A cylinder 13 with a space in it protrudes from the center of the housing 11. A plurality of oblique-conic spaces 14 is set concavely in the housing 11, equidistant from each other and surrounding the circumference of the cylinder 13. There is an inclined plane 141 between the oblique-cone spaces 14 and the housing 11. Separate protruding wheel parts 15 in equal arc-shapes surround the grating cogwheel 1. The light first focused by the protruding surface 12 is refracted to the corresponding protruding wheel parts 15 for focusing again, and then the light is conducted to the sensing chips S1 and S2 of the sensor 3 to produce different phase sequence signals.

Figure 5:
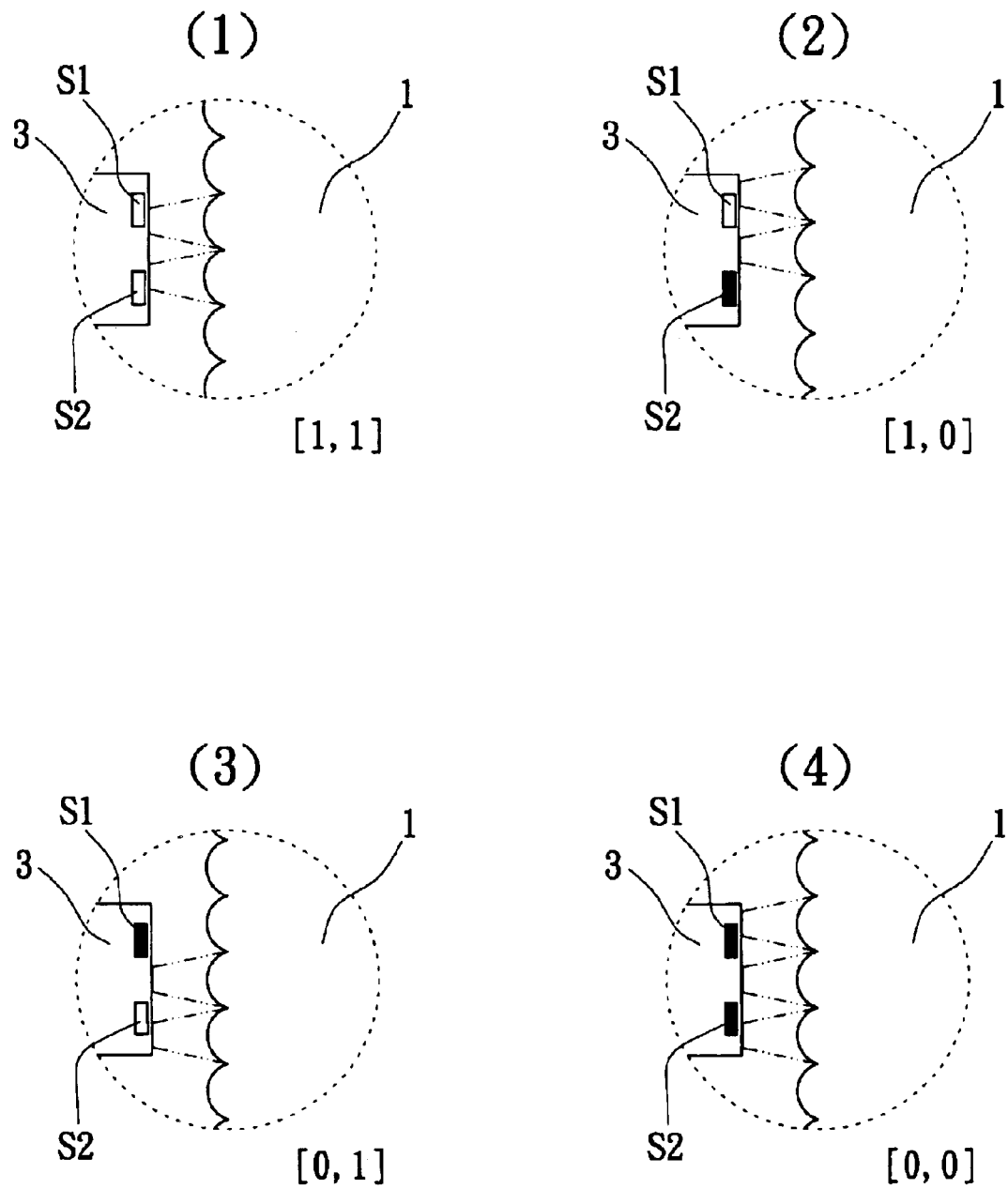
FIG. 5 shows front views of four signals (0,0), (1,1), (0,1), (1,0) on the oscilloscope when the grating cogwheel of the present invention rotates continuously.

The light emitted by the luminescence element 2 is focused by the protruding surface 12 of the grating cogwheel 1 at first, and the inclined plane 141 refracts the light and conducts it to the protruding wheel parts 15 for focusing again. Finally, the light is conducted to the sensing chips S1 and S2 of the sensor 3 to generate different phase sequence signals. When light is detected by the sensitization chips S1 and S2, ON signals are produced; and OFF signals are produced when the sensitization chips S1 and S2 do not detect the light. As FIG. 5 shows, when the grating cogwheel 1 rotates continuously, the oscilloscope displays four signals (0,0), (0,1), (1,1), (1,0).

The improved structure of the present invention as mentioned above has the following features:

1. The grating cogwheel can focus the light once and refract the light for focusing again.

2. Due to the protruding wheel parts being in equal arc-shapes, the number of the cogs on the grating cogwheel is increased, and the structure of the present invention does not affect the production process.

3. The structure of the present invention uses a circular protruding surface as the incident surface on the grating cogwheel for focusing, and the number of the granules on the grating cogwheel will not be limited.

Although the present invention has been described with reference to the preferred embodiment therefore, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A photoconductive encoder wheel, comprising:

a sensor;

a light source disposed perpendicular to the sensor; and a grating cogwheel having a housing, the grating cogwheel having a plurality of oblique-cone spaces located around a circumference of the housing and set concavely with respect to the housing and an incident surface surrounding a protruding surface, a plurality of protruding wheel parts being divided in equal arc-shapes and surrounding the grating cogwheel, an inclined surface being formed between each oblique-cone space and the housing, wherein light from the light source is refracted to the protruding wheel parts and focused thereby onto the sensor to generate different phase sequence signals.

2. The photoconductive encoder structure as in claim 1, wherein the housing is a disk-shaped housing, and the grating cogwheel further comprises a cylinder with a columnar space protruding from a center of the housing.

3. The photoconductive encoder structure as in claim 1, wherein the grating cogwheel is made of light-transparent materials.

* * * * *